(12) United States Patent
Schaller et al.

(10) Patent No.: US 8,110,498 B2
(45) Date of Patent: Feb. 7, 2012

(54) METHOD FOR PASSIVATING EXPOSED COPPER SURFACES IN A METALLIZATION LAYER OF A SEMICONDUCTOR DEVICE

(75) Inventors: Matthias Schaller, Moritzburg (DE); Daniel Fischer, Dresden (DE); Susanne Leppack, Dresden (DE)

(73) Assignee: Advanced Micro Devices, Inc., Austin, TX (US)

( * ) Notice: Subject to any disclaimer, the term of this patent is extended or adjusted under 35 U.S.C. 154(b) by 24 days.

(21) Appl. No.: 12/555,844

(22) Filed: Sep. 9, 2009

(65) Prior Publication Data
US 2010/0081277 A1    Apr. 1, 2010

(30) Foreign Application Priority Data
Sep. 30, 2008 (DE) .......................... 10 2008 049 720

(51) Int. Cl.
*H01L 21/44* (2006.01)
(52) U.S. Cl. ................. 438/653; 438/654; 257/E21.581
(58) Field of Classification Search .................. 438/653, 438/654; 257/E21.581
See application file for complete search history.

(56) References Cited

U.S. PATENT DOCUMENTS

| | | | |
|---|---|---|---|
| 6,177,347 B1 * | 1/2001 | Liu et al. ........................ | 438/675 |
| 6,692,903 B2 * | 2/2004 | Chen et al. ..................... | 430/329 |
| 7,144,802 B2 | 12/2006 | Xia et al. ........................ | 438/618 |
| 7,273,808 B1 * | 9/2007 | Lin ................................. | 438/622 |
| 2002/0106881 A1 * | 8/2002 | Jain ................................ | 438/600 |
| 2006/0024951 A1 | 2/2006 | Schuehrer et al. ............. | 438/627 |
| 2006/0148255 A1 * | 7/2006 | Lu et al. ......................... | 438/687 |

FOREIGN PATENT DOCUMENTS
DE    102004037089 A1    3/2006

OTHER PUBLICATIONS

Translation of Official Communication from German Patent Office for German Patent Application No. 10 2008 049 720.7 dated Aug. 17, 2009.

* cited by examiner

*Primary Examiner* — Lex Malsawma
(74) *Attorney, Agent, or Firm* — Williams, Morgan & Amerson, P.C.

(57) ABSTRACT

When forming sophisticated metallization systems, surface integrity of an exposed metal surface, such as a copper-containing surface, may be enhanced by exposing the surface to a vapor of a passivation agent. Due to the corresponding interaction with the metal surface, enhanced integrity may be accomplished, while at the same time damage of exposed dielectric surface portions may be significantly reduced compared to conventional aggressive wet chemical cleaning processes that are typically used in conventional patterning regimes.

15 Claims, 5 Drawing Sheets

METHOD FOR PASSIVATING EXPOSED COPPER SURFACES IN A METALLIZATION LAYER OF A SEMICONDUCTOR DEVICE

BACKGROUND OF THE INVENTION

1. Field of the Invention

Generally, the present disclosure relates to integrated circuits, and, more particularly, to the formation of metallization layers including highly conductive metals, such as copper, embedded into a dielectric material having low permittivity to enhance device performance.

2. Description of the Related Art

In an integrated circuit, a very large number of circuit elements, such as transistors, capacitors, resistors and the like, are formed in or on an appropriate substrate, usually in a substantially planar configuration. Due to the large number of circuit elements and the required complex layout of the integrated circuits, generally, the electrical connection of the individual circuit elements may not be established within the same level on which the circuit elements are manufactured, but requires one or more additional "wiring" layers, also referred to as metallization layers. These metallization layers generally include metal-containing lines, providing the inner-level electrical connection, and also include a plurality of inter-level connections, also referred to as vias, filled with an appropriate metal and providing the electrical connection between two neighboring stacked metallization layers, wherein the metal-containing lines and vias may also be commonly referred to as interconnect structures.

Due to the continuous shrinkage of the feature sizes of circuit elements in modern integrated circuits, the number of circuit elements for a given chip area, that is the packing density, also increases, thereby requiring an even larger increase in the number of electrical interconnections to provide the desired circuit functionality. Therefore, the number of stacked metallization layers usually increases as the number of circuit elements per chip area becomes larger. The fabrication of a plurality of metallization layers entails extremely challenging issues to be solved, such as providing the mechanical, thermal and electrical reliability of a plurality of stacked metallization layers that may be employed on sophisticated microprocessors. Currently, semiconductor manufacturers are increasingly replacing the well-known metallization metal aluminum by a metal that allows higher current densities and hence allows a reduction in the dimensions of the interconnections and thus the number of stacked metallization layers. For example, copper and alloys thereof are materials used for replacing aluminum due to their superior characteristics in view of higher resistance against electromigration and significantly lower electrical resistivity when compared with aluminum. Despite these advantages, copper also exhibits a number of disadvantages regarding the processing and handling of copper in a semiconductor facility. For instance, copper may not be efficiently applied onto a substrate at practical deposition rates by well-established deposition methods, such as chemical vapor deposition (CVD), and also may not be effectively patterned by the usually employed anisotropic etch procedures. Consequently, in manufacturing metallization layers including copper, the so-called damascene or inlaid technique (single and dual) is preferably used, wherein a dielectric layer is first applied and then patterned to receive trenches and vias, which are subsequently filled with a copper-based metal.

A further major drawback of the use of copper is its propensity to readily diffuse in many dielectric materials, such as silicon dioxide, which is a well-established and approved dielectric material in fabricating integrated circuits. It is, therefore, necessary to employ a so-called barrier material in combination with a copper-based metallization to substantially avoid diffusion of dielectrics into the copper, thereby negatively modifying its electric characteristics, and also reducing any diffusion of copper into the surrounding dielectric material, as copper may readily migrate to sensitive semiconductor areas, thereby significantly changing the characteristics thereof. The barrier material provided between the copper and the dielectric material should, however, in addition to the required barrier characteristics, exhibit good adhesion to the dielectric material, as well as to the copper, to impart superior mechanical stability to the interconnect, and should also have as low an electrical resistance as possible so as to not unduly compromise the electrical properties of the interconnection.

With the continuous shrinkage of features sizes of the circuit elements, the dimensions of the interconnects are reduced too, thereby also necessitating a reduced layer thickness of the barrier materials in interconnects so as to not unduly consume precious space of the actual metal that exhibits a considerably higher conductivity compared to the barrier material. Hence, complex barrier technologies are required to support further device scaling, wherein the usage of dielectric materials with reduced permittivity may even impart further restrictive constraints to the barrier layer, and also to preparation of exposed copper surfaces prior to applying the barrier materials, since copper readily reacts with oxygen and other reactive components, such as fluorine, sulfur and the like, which may be present in traces in the clean room ambient. Moreover, any etch byproducts created during the preceding etch process for patterning the dielectric material may also have a negative impact on the exposed copper of the underlying metal region, as will be described with reference to FIG. 1 for a typical process technique for forming sophisticated copper-based integrated circuits.

FIG. 1 depicts a schematic cross-sectional view of a semiconductor structure 100 comprising a substrate 101, for example, a semiconductor substrate bearing a plurality of individual circuit elements (not shown), such as transistors, resistors, capacitors and the like. The substrate 101 is representative of any type of appropriate substrate with or without any additional circuit elements and may, in particular, represent sophisticated integrated circuit substrates having included therein circuit elements with critical feature sizes in the deep sub-micron range. A first dielectric layer 102 is formed above the substrate 101 and includes a conductive region 104, for instance an interconnect structure comprised of a metal line 103, such as a copper line, and a first barrier layer 106 comprised of tantalum, and a second barrier layer 105 comprised of tantalum nitride. The dielectric layer 102 and the interconnect feature 104 may represent a first metallization layer. An etch stop layer 110 comprised of, for instance, silicon nitride, nitrogen-enriched silicon carbide and the like is formed above the dielectric layer 102 and partially above the copper line 103. A second dielectric layer 107 comprising at least in its upper portion 107B a dielectric material of low permittivity, as is typically used for obtaining reduced parasitic capacitances between adjacent metal lines, is formed over the etch stop layer 110 and the first dielectric layer 102 and has formed therein a trench 109 in the upper portion 107B and a via 108 in a lower portion 107A connecting to the metal line 103, thereby exposing a contamination layer 111 located on a surface portion 103A of the copper line 103. For example, the lower portion 107A may be comprised of fluorine-doped silicon dioxide deposited from TEOS, which is also referred to as FTEOS and which has a lower permittivity compared to pure TEOS silicon dioxide.

A typical process flow for forming the semiconductor structure 100 as shown in FIG. 1 may include the following steps, wherein, for the sake of simplicity, only the formation of the second metallization layer, i.e., the second dielectric layer 107 and the metal interconnect feature to be formed therein, will be described in detail as the processes for forming the interconnect feature 104 in the first dielectric layer 102 may substantially involve the same process steps. Thus, after planarizing the dielectric layer 102, including the inter-connect feature 104, and forming the etch stop layer 110, thereby passivating the interconnect structure 104, as pure copper forms a highly reactive surface, the dielectric layer 107 is deposited by well-known deposition methods, such as plasma-enhanced CVD, spin-on techniques and the like, wherein, as previously pointed out, silicon dioxide including fluorine deposited from TEOS by CVD is frequently employed. Subsequently, the dielectric layer 107 is patterned by well-known photolithography and anisotropic etch techniques, wherein an intermediate etch stop layer (not shown) may be used in patterning the trench 109. It should further be noted that different approaches may be employed in forming the trench 109 and the via 108, such as a so-called via first trench last approach, or a trench first via last approach, or, in other approaches, the via 108 may be formed first and filled with metal prior to the formation of the trench 109. In the present example, a so-called dual damascene technique is described in which the trench 109 and the via 108 are simultaneously filled with metal.

Irrespective of the etch scheme used, in the last etch step for forming the via 108, the etch stop layer 110 is opened and the copper surface 103A is exposed to the reactive etch ambient, which may contain fluorine, in particular when the dielectric layer 107 also comprises fluorine. As a consequence, the contamination layer 111 containing a copper/fluorine/oxygen compound may be formed on the surface portion 103A. Since the contamination layer 111 may significantly affect the further processes, such as the formation of a barrier layer and seed layer for the subsequent copper fill process, via reliability is reduced and product yield is lowered. The contamination layer 111 is typically removed by a wet chemical etch process on the basis of, for example, diluted fluoric acid (HF) or other appropriate chemicals. It has been found that, during this wet chemical process, the contamination layer 111 is effectively removed yet the surface portion 103A is again exposed to a reactive environment, thereby resulting in a recreation of a contamination layer having a similar negative effect on the further processing as the layer 111.

Moreover, in sophisticated applications, the dielectric layer 107 may comprise sensitive dielectric materials having a dielectric constant of 2.7 and less, which may frequently be referred to as ultra low-k (ULK) dielectrics, which may also be affected by a wet chemical process, thereby resulting in any process non-uniformities during the further processing, for instance by depositing a conductive barrier material and a seed layer, depending on the corresponding process strategy. Furthermore, the metal region 104 may comprise, in addition to the etch stop layer 110, a conductive cap layer in advanced applications in view of enhancing overall electromigration behavior of the metal region 104. To this end, well-established metal alloys, such as cobalt/tungsten/phosphorous (COWP) and the like, may be used in this case which, however, may be removed during the corresponding wet chemical etch process. Thus, in many cases, even under-etched areas may be created at lower sidewall portions of the via opening 108, which may result in a significant contact deterioration and which may require sophisticated process techniques, such as wet chemical etch processes on the basis of sophisticated chemistries and/or corresponding techniques for refilling any under-etched areas by an additional deposition process. On the other hand, the exposed copper-containing surface of the metal region 104 may be exposed due to reactive components that may be present in the ambient atmosphere, even after performing the corresponding wet chemical etch process, thereby requiring further cleaning steps, for instance, prior to forming a conductive barrier layer and the like wherein, however, the more or less aggressive chemicals used during the preceding cleaning process may result in a certain degree of surface modification, thereby contributing to further process non-uniformities which may finally result in reduced contact reliability or production yield.

The present disclosure is directed to various methods that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure relates to techniques for forming sophisticated metallization systems of semiconductor devices while reducing overall process complexity associated with the surface preparation of sensitive metal regions, such as copper-containing metal surfaces, in that an enhanced degree of surface passivation may be provided without requiring highly aggressive wet chemical etch steps, which may conventionally be the reason for material degradation of sensitive dielectric materials and the like, as previously discussed. The present disclosure contemplates a treatment of sensitive exposed metal surface areas on the basis of a vaporized chemical agent, such as a corrosion hindering agent, which may be applied in an appropriate low pressure ambient. For instance, in some illustrative embodiments disclosed herein, the metal surface may be exposed to the low pressure vapor phase ambient immediately after removing material from the initially covered metal surface, wherein, based on the vaporized state of the corrosion hindering agent, an enhanced degree of surface passivation may be accomplished, substantially without significantly negatively affecting other dielectric surface areas. Thus, any further process steps may be performed on the basis of a passivated surface portion, thereby enabling a highly efficient overall manufacturing flow in which wet chemical aggressive cleaning steps may be omitted, according to some illustrative embodiments disclosed herein. Hence, in this case, overall process complexity may be reduced since dedicated wet chemical cleaning tools may no longer be required, while, in some embodiments, the corresponding low pressure vapor phase ambient may effectively be established without requiring additional transport activities of the substrate or even without exposing the substrate to ambient atmosphere.

One illustrative method disclosed herein comprises forming an opening in a dielectric layer of a metallization layer of a semiconductor device, wherein the opening connects to a copper-containing metal region located below the opening. The method further comprises exposing a surface of the copper-containing metal region to a vapor phase ambient to passivate the surface. Moreover, a barrier/adhesion layer is deposited on the surface.

A further illustrative method disclosed herein comprises exposing a metal surface of a metal region of a metallization layer of a semiconductor device to a low pressure ambient that contains a vapor of a corrosion hindering agent, wherein the metal region is embedded in a dielectric material. Moreover, the method comprises forming a material layer on the metal surface.

A still further illustrative method disclosed herein comprises forming a via opening in a dielectric layer of a metallization layer of a semiconductor device in an etch ambient, wherein the via opening connects to a copper-containing metal region that is located below the via opening. The method additionally comprises exposing a portion of the metal region exposed by the via opening to a vapor phase ambient without exposing the semiconductor device to ambient atmosphere after exposing the semiconductor device to the etch ambient. Finally, a barrier/adhesion layer is formed in the via opening.

BRIEF DESCRIPTION OF THE DRAWINGS

The disclosure may be understood by reference to the following description taken in conjunction with the accompanying drawings, in which like reference numerals identify like elements, and in which.

Figure 1:
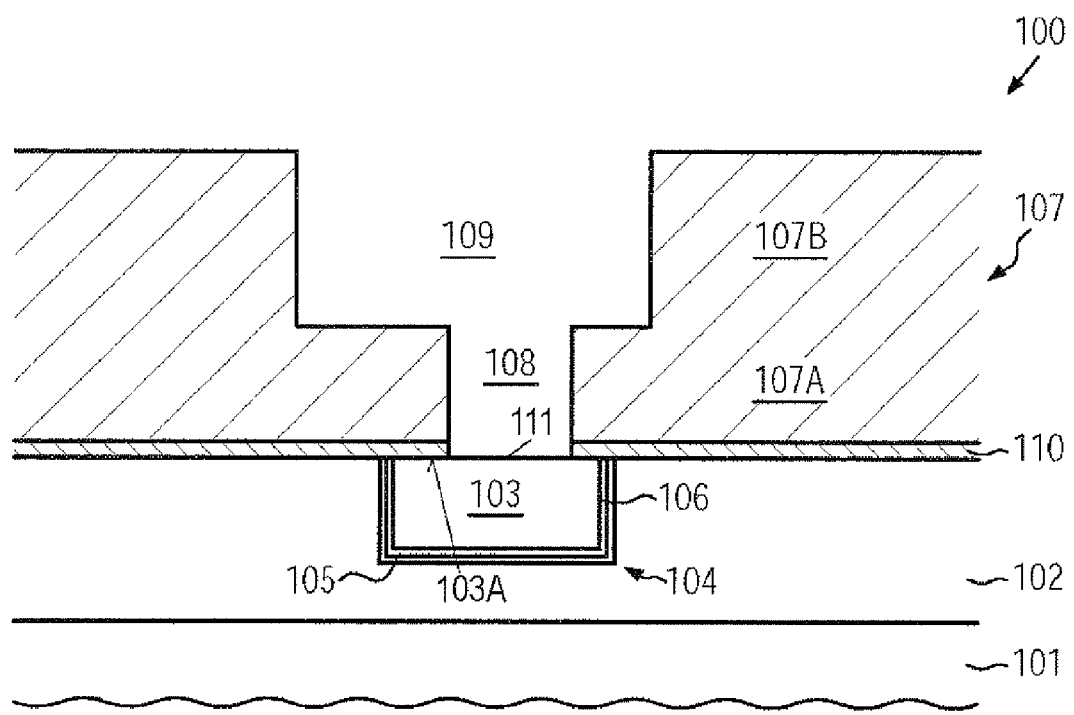
FIG. 1 schematically illustrates a cross-sectional view of a semiconductor device including an interconnect structure formed in a dielectric material, wherein irregularities in the metal or the dielectric material may be created by contamination of an exposed surface portion during the formation of a via on the basis of a wet chemical cleaning process, according to conventional approaches.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Generally, the present disclosure provides a technique that addresses the problems of surface contamination of exposed metal regions during the fabrication of sophisticated metallization systems, which typically may be associated with reduced reliability and yield when integrity of an exposed metal surface is to be provided on the basis of aggressive wet chemical etch recipes according to conventional strategies. As previously explained, fluorine, oxygen and the like may readily react with exposed copper surface areas, thereby generating a plurality of surface defects, which may lead to significant irregularities during the further processing of the semiconductor devices. For this reason, in conventional approaches, well-established wet chemical cleaning processes, for instance on the basis of hydrofluoric acid, may be performed in order to remove corresponding contaminations wherein, however, an efficient passivation may not necessarily be accomplished. Furthermore, the aggressive wet chemical solutions may result in a significant interaction with the exposed dielectric surface areas, which may also affect the further processing of the semiconductor device and possibly also the finally obtained performance of the resulting interconnect structure in terms of overall resistivity, reliability and the like. It has been discovered that a treatment performed on the basis of a gaseous ambient containing vapor of a passivation agent or corrosion hindering agent may provide enhanced surface integrity of the exposed metal surface during the further processing and, on the other hand, may not significantly affect the characteristics of exposed dielectric surface portions, thereby providing enhanced performance of corresponding interconnect structures, since highly aggressive wet chemical cleaning processes may be omitted, which may conventionally result in reduced performance and/or reliability of the corresponding interconnect structures. In some illustrative embodiments, the corresponding vapor phase treatment may immediately be performed after actually exposing the corresponding metal surface, for instance, during an etch process, thereby efficiently avoiding or at least significantly reducing the creation of any contaminants, which may thus enable a manufacturing sequence in which aggressive cleaning processes may be omitted or wherein corresponding cleaning processes may be performed on the basis of less aggressive process conditions. Although the exact mechanism of the interaction of the vapor phase ambient with the exposed metal surface and a corresponding dielectric portion is not yet fully understood, electrical performance and overall reliability of interconnect structures may be enhanced, for instance, by omitting a highly aggressive wet chemical etch process, for instance after etching a via opening so as to extend to a copper-containing surface area, while nevertheless corresponding process parameters for establishing an appropriate vapor phase ambient may be adjusted in a highly controllable manner, thereby ensuring overall process uniformity. For example, an appropriate vapor phase ambient may be established by using corrosion inhibiting materials, such as materials formed on the basis of triazole, such as benzene triazole (BTA) and the like, which represents well-established process liquids that may frequently be used in wet chemical cleaning processes in combination with, for instance, hydrofluoric acid to remove corrosions and provide enhanced surface integrity. In other illustrative embodiments, the corrosion inhibiting material may comprise one or more of the following substances: 4-Amino benzo nitril, 2-amino pyrimidin, 2-thiazolin-2-thiol, 2,4,6 triamino-1,3,5-triazin. By using corresponding chemical agents on the basis of a vapor phase treatment, however, significant enhancement with respect to surface integrity may be obtained, while reducing any negative effects on dielectric surface portions, while additionally the corresponding vapor phase may be established within the same process chamber as used for etching a corresponding via opening. Thus, by omitting a corresponding aggressive wet chemical etch process, an increased overall cycle time of the semiconductor device may be accomplished, while also reduced efforts in terms of process tools may be accomplished since dedicated process tools for performing aggressive wet chemical cleaning processes may no longer be required, or may be dedicated to other processes. Consequently, based on the surprising enhanced effects with respect to maintaining surface integrity and reduced interaction with dielectric surface portions, an overall enhanced manufacturing flow may be accomplished, according to some illustrative embodiments.

With reference to FIGS. 2a-2h, further illustrative embodiments will now be described in more detail, wherein reference may also be made to FIG. 1, if appropriate.

Figure 2A:
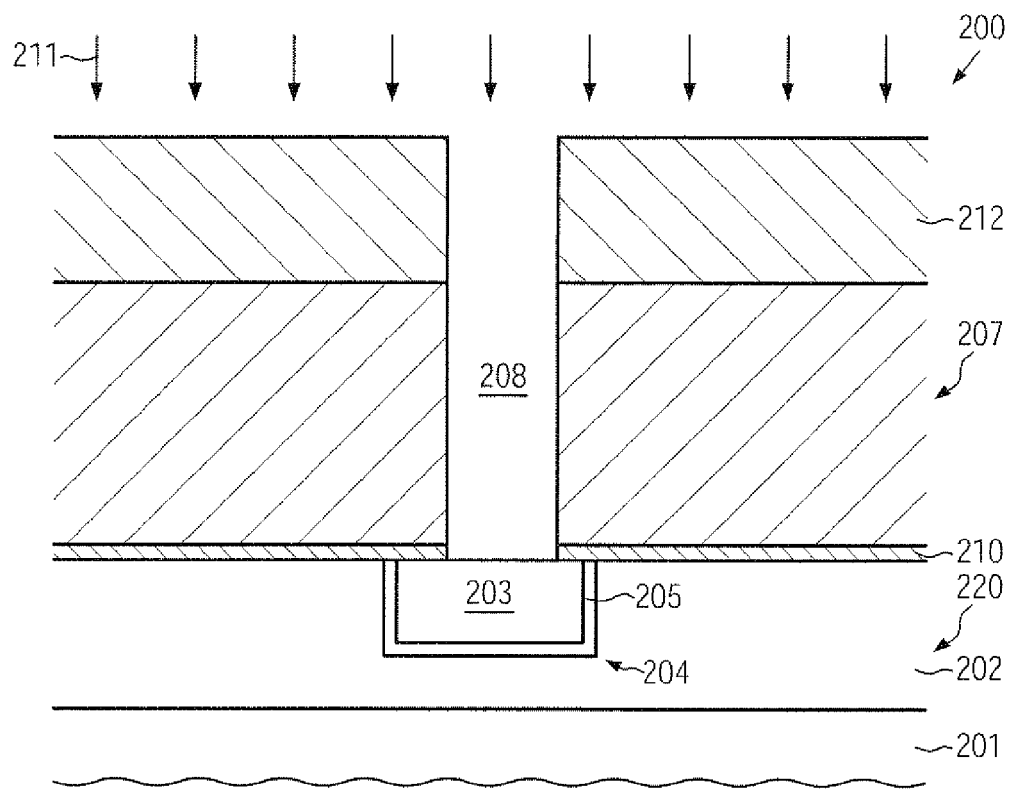
FIGS. 2a-2d schematically illustrate cross-sectional views of a metallization system of a semiconductor device during various manufacturing stages in forming a contact connecting to a lower lying metal region, wherein enhanced surface integrity of the metal region may be accomplished by performing a treatment on the basis of a vaporized agent, according to illustrative embodiments.

FIG. 2a schematically illustrates a cross-sectional view of a semiconductor device 200 in an advanced manufacturing stage. The semiconductor device 200 may comprise a substrate 201 which may represent any appropriate carrier material for forming therein and thereabove corresponding circuit elements, such as transistors and the like, as is also previously explained with reference to the semiconductor device 100. Moreover, a metallization layer 220 may be provided above the substrate 201 and may comprise a dielectric material 202 in which may be embedded a metal region 204, which may comprise a conductive barrier layer 205 that separates a highly conductive metal 203, such as a copper-containing metal, from the dielectric material 202. Furthermore, the metallization layer 220 may comprise a dielectric cap layer or etch stop layer 210 that may reliably confine the metal 203 and which may also provide etch stop capabilities, as is also described above with respect to FIG. 1. Furthermore, in the manufacturing stage shown, a dielectric material 207, which may represent at least a portion of the dielectric material of a further metallization layer, may be formed above the metallization layer 220. For example, the dielectric layer 207 may represent a low-k dielectric material if sophisticated applications are considered, while, in other cases, more "conventional" dielectric materials may be used.

The semiconductor device 200 as shown in FIG. 2a may be formed on the basis of similar process techniques as are previously described with reference to the device 100 as shown in FIG. 1. That is, after forming the dielectric material 207 on the basis of any appropriate deposition technique, an etch mask 212, such as a resist mask, possibly in combination with an anti-reflective coating (ARC) material or any hard mask material, may be formed in accordance with overall device requirements. That is, the etch mask 212 may define the lateral size and the position of an opening 208 formed in the dielectric material 207 on the basis of an appropriate etch process 211. For this purpose, well-established anisotropic etch recipes may be used in order to establish an appropriate etch ambient for the process 211, wherein, in a final phase of the etch ambient 211, the etch stop layer 210 or dielectric cap layer may also be opened, wherein the resist mask may also be removed, depending on the overall process strategy. In other cases, the etch mask 212 may be removed in a separate etch step, which may, in some illustrative embodiments, be performed in the same etch chamber as may be used for establishing the etch ambient for the process 211.

Figure 2B:
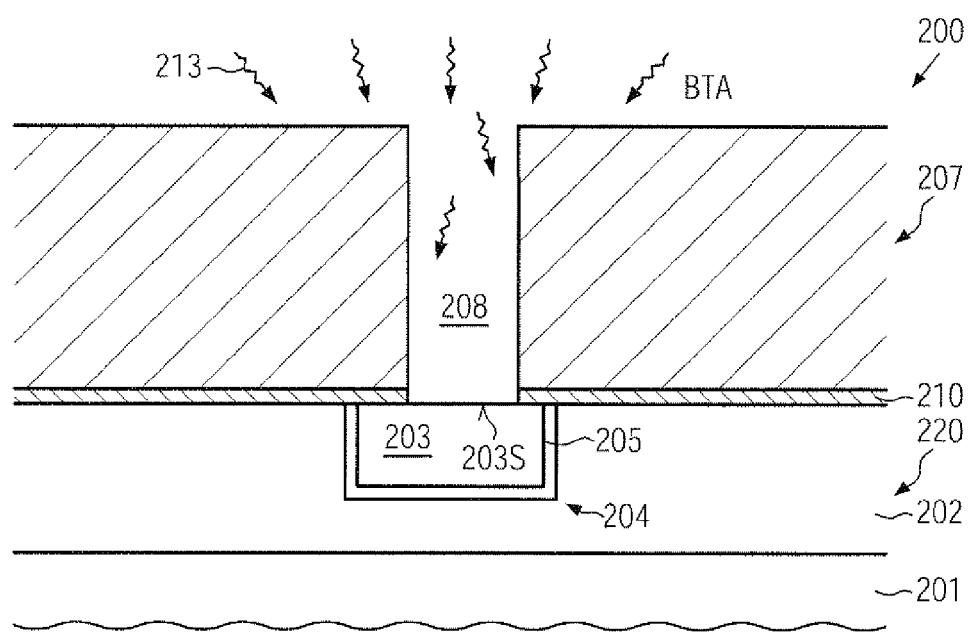

FIG. 2b schematically illustrates the semiconductor device 200 in a further manufacturing stage, which, in some illustrative embodiments, may represent a process step of the manufacturing flow which immediately follows the etch process 211. In this manufacturing stage, the semiconductor device 200 is exposed to a low pressure ambient 213, in which a passivation or corrosion inhibiting agent may be present in its vapor phase. That is, the low pressure ambient 213 may be established on the basis of appropriate elevated temperatures in order to vaporize the corresponding agent, which may typically be provided as a wet chemical solution when used under standard atmospheric conditions at room temperature. In one illustrative embodiment, the vapor phase ambient 213 may be established by using triazole, or any derivative thereof, such as benzene triazole (BTA), which is a well-established corrosion inhibiting material in the context of copper metallization systems. In other illustrative embodiments, other substances, such as 4-Amino benzo nitril, 2-amino pyrimidin, 2-thiazolin-2-thiol, 2,4,6 triamino-1,3,5-triazin, and the like may be used. Thus, in some illustrative embodiments, a process temperature of the low pressure ambient 213 may be adjusted to approximately 80-350° C. in order to establish the desired vapor phase, which may thus interact with an exposed surface area 203S of the highly conductive metal 203. It should be appreciated that a corresponding process temperature is to be understood as a temperature that is also established for the substrate 201 so as to avoid condensation of any components included in the vapor phase ambient 213 upon contact of the device 200. For instance, for a low pressure in the range of approximately 20 mTorr-5 Torr, a corresponding agent may be supplied in a vaporized state into a corresponding process chamber while the substrate 200 may also be maintained at an elevated temperature in the above-specified range. Although presently not fully understood, the vapor phase ambient 213 may interact with the exposed surface 203S, thereby passivating the surface thereof so that the creation of any contaminants during subsequent process steps may be significantly reduced, while, on the other hand, a significant chemical modification of exposed dielectric surface areas of the dielectric layer 207 may be substantially avoided or may at least be significantly reduced compared to corresponding modifications caused by aggressive wet chemical cleaning processes, as explained above. The device 200 may be exposed to the ambient 213 for a time period of approximately 10-60 seconds.

In some illustrative embodiments, the vapor phase ambient 213 may be established in the same process chamber as may be used for performing the etch process 211 without exposing the semiconductor device 200 to ambient atmosphere, thereby maintaining any intermediate contamination of the exposed surface portion 203S at a very low level. Furthermore, any additional substrate transport activities may be avoided and respective dedicated process tools for establishing the ambient 213 may not be necessary, thereby providing a highly efficient process flow. In other cases, the vapor phase ambient 213 may be established in a different process chamber, however within the same process tool, i.e., a corresponding cluster process tool, which may include a plurality of process chambers, wherein transportation from one process chamber to another may also be accomplished in a low pressure ambient without exposing the corresponding substrates to the ambient atmosphere. Thus, also in this case, a very efficient manufacturing flow may be accomplished, wherein overall cycle time of products may be reduced when omitting a corresponding aggressive wet chemical cleaning process. In still other illustrative embodiments, short exposure to ambient atmosphere occurs, as will be explained later on in more detail, while nevertheless the vapor phase ambient 213 may provide enhanced overall surface integrity compared to strategies in which a corresponding passivating treatment is not applied.

Figure 2C:
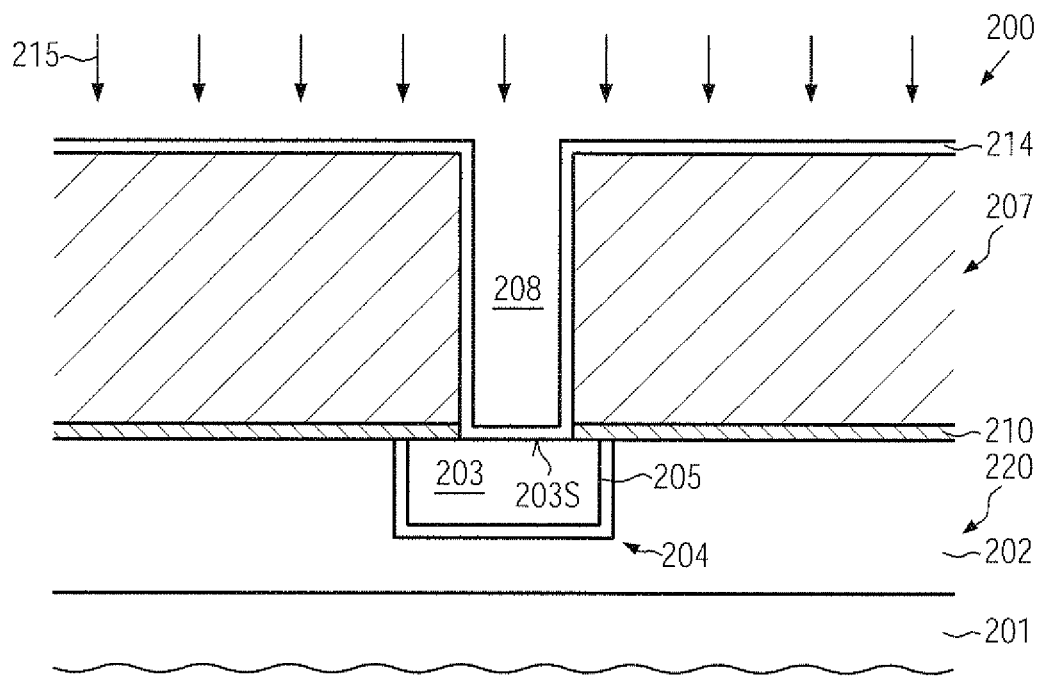

FIG. 2c schematically illustrates the semiconductor device 200 in a further advanced manufacturing stage. As illustrated, a conductive barrier material 214 may be formed on exposed surface areas of the dielectric layer 207 and on the exposed surface 203S, which may be accomplished on the basis of an appropriate deposition ambient 215. For instance, tantalum, tantalum nitride and the like may be efficiently deposited on the basis of sputter deposition, CVD, possibly as a self-limiting process regime, and the like, wherein other conductive barrier materials may also be deposited by electrochemical deposition processes and the like. In some illustrative embodiments, the deposition process 215 may include a preceding cleaning process, for instance on the basis of ion bombardment, a heat treatment at elevated temperatures of approximately 70-200° C. and the like in order to prepare the surface 203S for appropriately receiving the material 214. Consequently, the enhanced passivated state of the surface 203S may be maintained throughout the entire substrate handling processes and in possible intermediate manufacturing processes, thereby providing a reduced degree of contamination of the surface 203S, which immediately prior to actually depositing the material 214 may thus be appropriately conditioned. In other cases, the corresponding deposition process may be performed without any dedicated preceding surface preparations. For example, a sputter deposition may be performed on the basis of appropriately selected deposition parameters without requiring a dedicated cleaning phase. In other cases, a "sputter etch" step may be performed prior to actually depositing the material 214. For this case, an argon-enriched ambient may be established in the deposition ambient 215 so that, in total, a greater amount of material may be released from the surface 203S as may actually be deposited thereon, thereby preparing the surface for the actual deposition of the material 214.

Figure 2D:
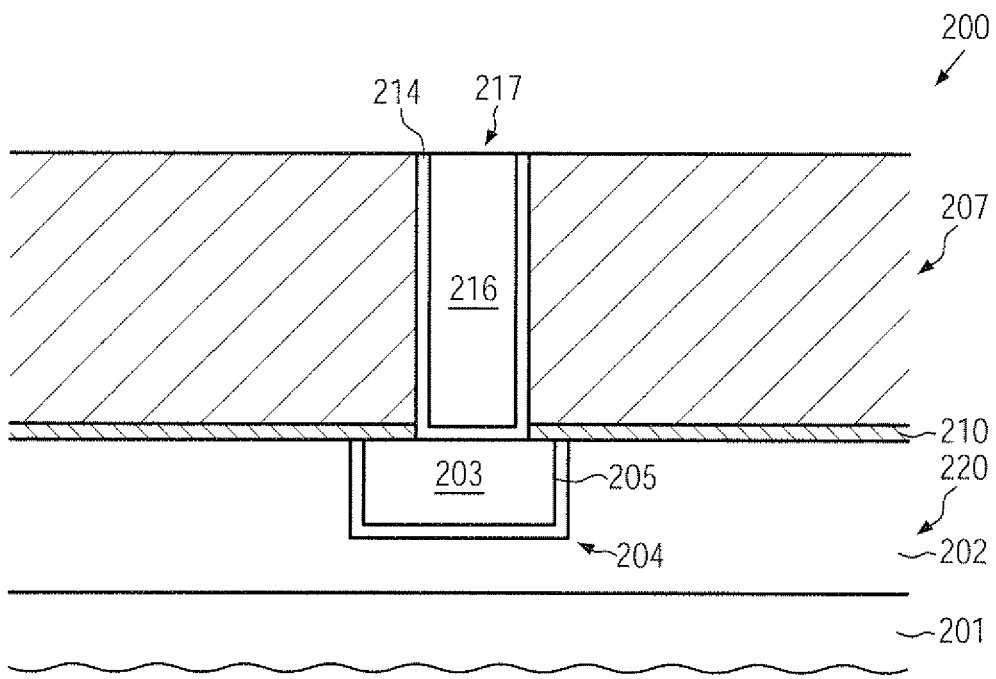

FIG. 2d schematically illustrates the semiconductor device 200 in a further advanced manufacturing stage in which an interconnect feature 217 may be provided in the dielectric layer 207 and may represent a via connecting to the metal region 204. For example, a copper-containing material 216 may be provided, as may typically be required in sophisticated metallization systems. The metal 216 may typically be deposited on the basis of electrochemical deposition techniques, such as electroless plating, electroplating and the like, wherein, if required, an appropriate seed material, such as copper, may be deposited first prior to actually filling the opening 208 by the electrochemical deposition process. Thereafter, any excess material may be removed, for instance on the basis of wet chemical etch techniques in combination with chemical mechanical polishing (CMP) and the like in order to obtain the interconnect feature 217 as illustrated.

Consequently, due to the high degree of surface integrity obtained by the vapor phase treatment 213 (FIG. 2b), enhanced overall process conditions may be accomplished during the further manufacturing steps for forming the interconnect feature 217, thereby providing enhanced performance and reliability thereof.

Figure 2E:
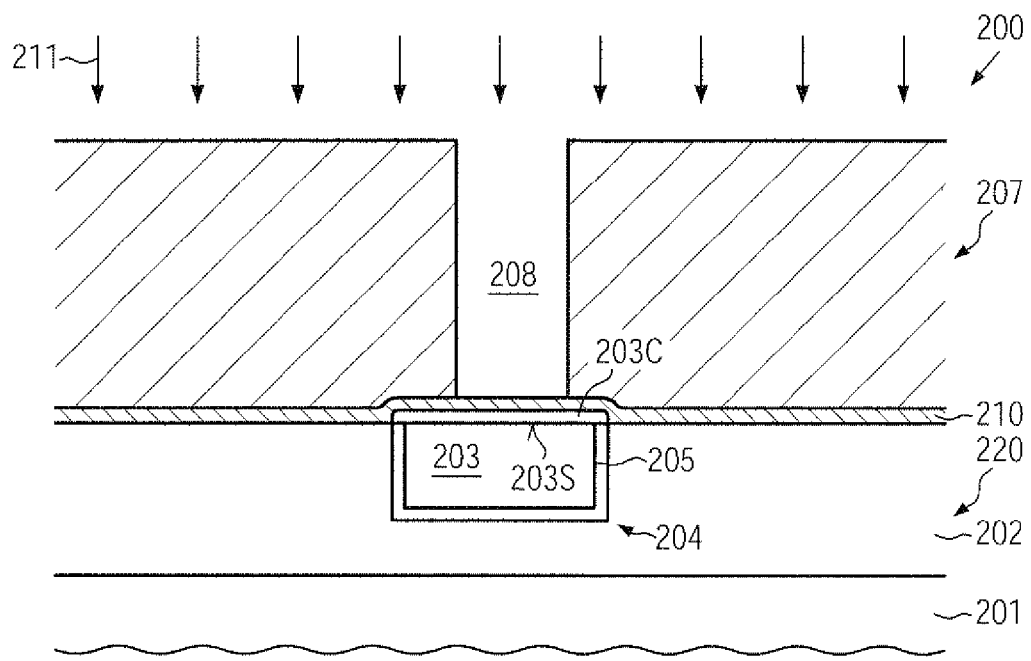
FIGS. 2e-2f schematically illustrate cross-sectional views of the semiconductor device according to still further illustrative embodiments, in which a vapor phase treatment may be applied in a sophisticated metallization system comprising a metal region having a conductive cap layer in combination with a ULK material.

FIG. 2e schematically illustrates a cross-sectional view of the semiconductor device 200 according to further illustrative embodiments, in which the metal region 204 may comprise a conductive cap layer 203C, for instance in the form of any appropriate metal alloy, such as a cobalt/tungsten/phosphorous alloy, a cobalt/tungsten/boron alloy, a nickel/molybdenum/phosphorous alloy and the like. For instance, corresponding metal alloys may frequently be used in sophisticated applications, in which enhanced overall electromigration behavior of the metal region 204 may be required. Furthermore, in illustrative embodiments, the dielectric material 207 may be provided in the form of a ULK material, which may even exhibit an increased sensitivity to aggressive etch ambients so that any additional aggressive cleaning process may result in additional damage of the sensitive dielectric material 207. As illustrated, the etch process 211 may be performed to obtain the opening 208, which may extend to the etch stop layer 210, which may be accomplished on the basis of well-established process recipes. Furthermore, a corresponding etch mask, such as a resist mask, may also be removed during or after the etch process 211. Typically, in dual damascene strategies, a further etch step may be performed in order to produce a trench in an upper portion of the dielectric material 207, which may be accomplished by performing a further lithography step for providing a corresponding etch mask for the subsequent etch process. Finally, the opening 208 may be increased so as to extend at least into the conductive cap layer 203C, while, in some illustrative embodiments, a corresponding final etch step may result in the exposure of the surface area 203S. Thus, in some illustrative embodiments, any exposed metal of the metal region 204 may be exposed to a vapor phase ambient in order to enhance surface integrity during the further processing, as previously explained, while at the same time avoiding an aggressive wet chemical etch process, which in conventional strategies may result in a significant material removal of the cap layer 203C. As previously explained, even significant under-etch areas of the etch stop layer 210 may typically be observed due to a significant material removal of the cap layer 203C during corresponding aggressive wet chemical etch steps.

Figure 2F:
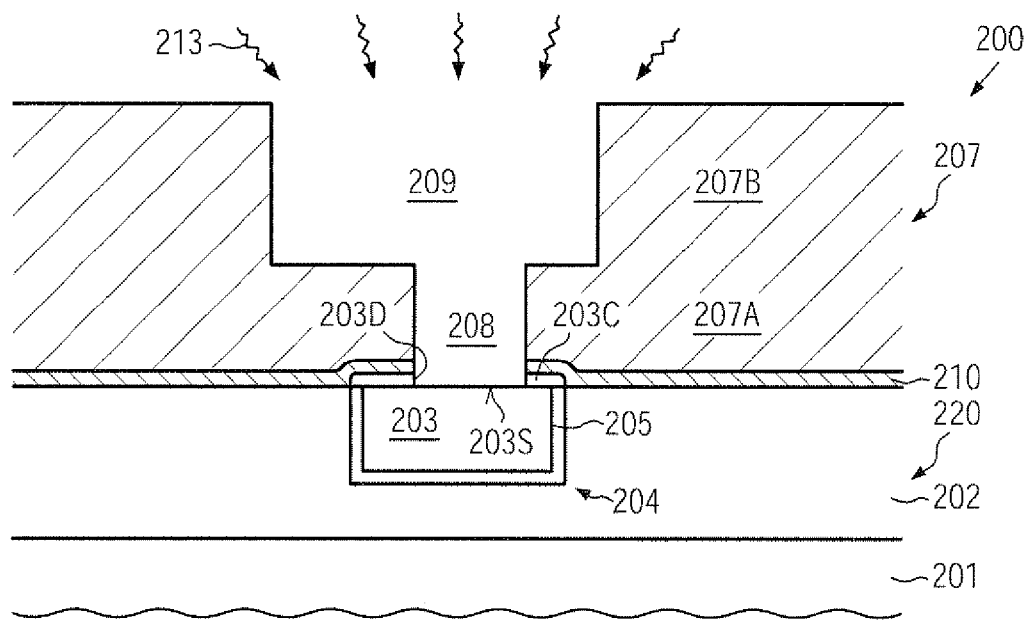

FIG. 2f schematically illustrates the semiconductor device 200 when exposed to the vapor phase ambient 213, in which the surface 203S may be passivated in a highly efficient manner, as explained above, while maintaining integrity of the exposed sidewall portions 203D of the conductive cap layer 203C. On the other hand, a significant modification within a trench opening 209 and the via opening 208 may be substantially avoided, thereby providing enhanced integrity of the dielectric material 207 while also providing superior integrity of the surface 203S. Thereafter, the further processing may be continued by depositing an appropriate conductive barrier material, as previously explained, while in other cases, if required, additional cleaning processes may be performed, however, on the basis of a less aggressive chemistry so as to maintain the conductive cap layer 203C adjacent to the opening 208.

Figure 2G:
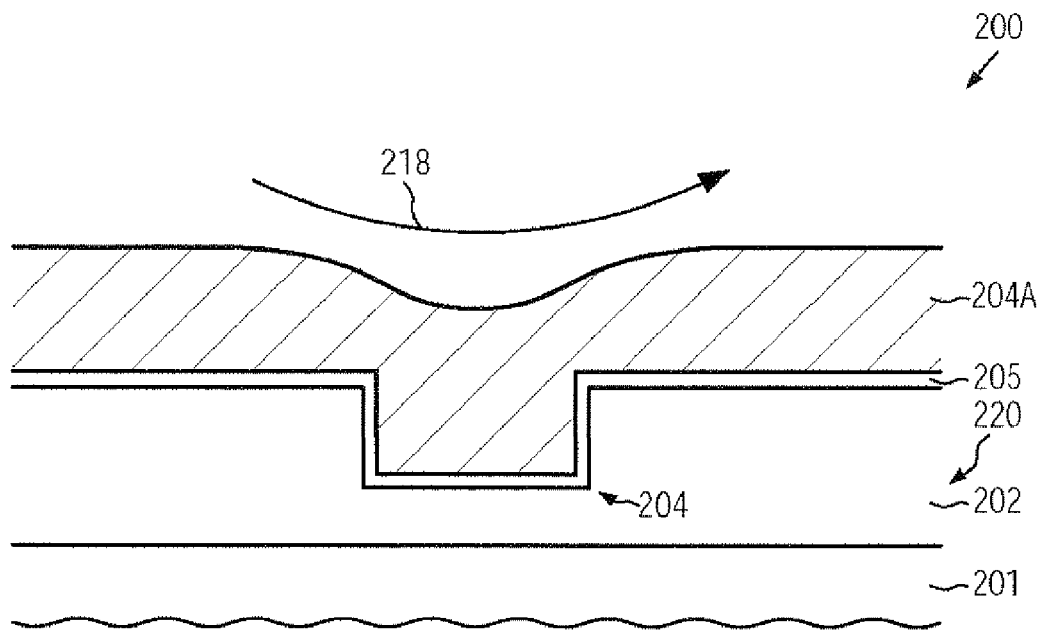
FIGS. 2g-2h schematically illustrate cross-sectional views of a metallization system in which a metal surface may be formed by removing excess material followed by a vapor phase treatment to provide enhanced surface integrity during the further processing of the semiconductor device, according to still further illustrative embodiments.

FIG. 2g schematically illustrates the semiconductor device 200 in a manufacturing stage in which the metal region 204 may be formed within the dielectric material 202. As illustrated, the barrier layer 205 may be formed on exposed portions of the dielectric material 202 and a metal layer 204A may be formed so as to completely fill a corresponding opening that corresponds to the metal region 204. As previously explained, in sophisticated applications, the metal layer 204A may typically be formed on the basis of electrochemical deposition techniques, wherein a reliable fill of trenches and vias may require sophisticated deposition techniques, thereby also resulting in a certain degree of overfill. Thus, any excess material of the layer 204A and of the barrier layer 205 may have to be removed, wherein frequently, at least in a final stage, a removal process 218 based on CMP may be employed. Consequently, after the removal process 218, the metal region 204 may be provided as an electrically insulated region, as required, thereby producing an exposed surface area extending across the entire metal region 204.

Figure 2H:
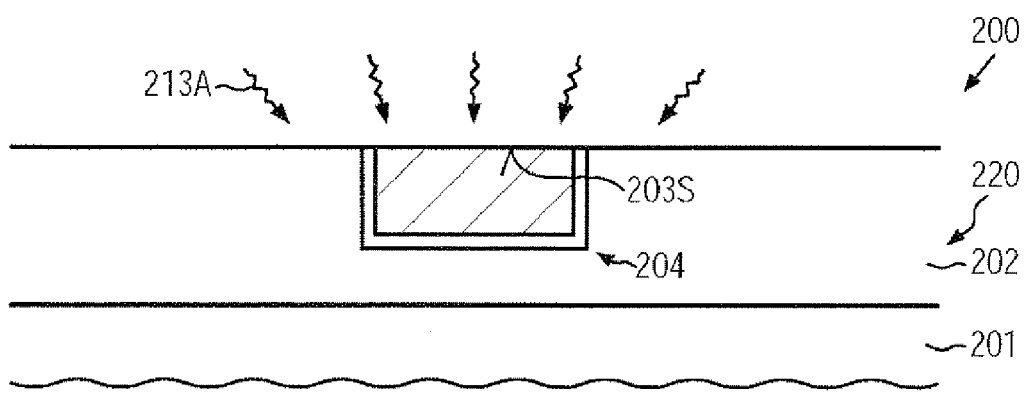

FIG. 2h schematically illustrates the semiconductor device 200 after the removal process 218 (FIG. 2g). Hence, as illustrated, the surface 203S may be exposed, wherein it should be appreciated that the surface 203S is to represent the entire surface of the metal region 204, which may typically represent a metal line of the metallization layer 220. In the embodiment shown, the device 200 may be subjected to a vapor phase treatment 213A, for instance on the basis of corresponding corrosion inhibiting agents, as previously explained, thereby providing enhanced surface integrity of the surface 203S, while on the other hand not unduly affecting the dielectric material 202. Based on the passivated surface 203S, further cleaning processes may be performed, for instance in view of removing particles and the like, which, however, may be accomplished on the basis of less aggressive process steps, thereby further maintaining integrity of the dielectric material 202. Consequently, by performing the treatment 213A, which may, for instance, be performed immediately after completing the removal process 218, enhanced flexibility in designing the overall manufacturing flow may be accomplished, since any queue time constraints with respect to passivating the surface 203S by forming a corresponding cap layer, such as a conductive cap layer or a dielectric cap layer, may be relaxed due to the enhanced surface integrity obtained by the treatment 213A. Furthermore, cleaning the surface 203S may be performed on the basis of less aggressive chemicals, which may thus contribute to enhanced integrity of the dielectric material 202, which may be provided as a sensitive ultra low-k dielectric material in sophisticated applications. Thereafter, the further processing may be continued by well-established process techniques, wherein also the vapor phase treatment 213 (FIG. 2f, FIG. 2b) may be performed when exposing a portion of the surface 203S during patterning of a further metallization layer.

As a result, the present disclosure provides techniques for enhancing integrity of a sensitive metal surface, such as a metal-containing surface, by exposing the metal surface to a vaporized corrosion inhibiting or passivation agent, thereby resulting in a significantly reduced degree of damage of exposed dielectric surface portions. Furthermore, the vapor phase treatment may readily be implemented into a conventional process sequence, for instance, the corresponding vapor phase treatment may be performed in an etch chamber or may be performed in the same cluster tool without requiring exposure to ambient atmosphere, so that the enhanced surface integrity may be obtained on the basis of a process flow which may allow omitting any aggressive wet chemical cleaning processes. The enhanced surface integrity obtained by the vapor phase treatment may result in enhanced electrical performance and increased reliability of the corresponding interconnect structures.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
   forming an opening in a dielectric layer of a metallization layer of a semiconductor device, the opening connecting to a copper-containing metal region located below said opening;
   exposing a surface of said copper-containing metal region exposed by said opening to a vapor phase ambient to passivate said surface, wherein said vapor phase ambient is established on the basis of a corrosion hindering agent that is a liquid under standard atmospheric conditions, said corrosion hindering agent comprising at least one of triazole, 4-amino benzo nitril, 2-amino pyrimidin, 2-thiazolin-2-thiol and 2,4,6 triamino-1,3,5-triazin; and
   after exposing said surface to said vapor phase ambient, depositing a barrier/adhesion layer on said surface exposed by said opening, wherein said barrier/adhesion layer is deposited without a wet chemical cleaning process performed after forming said opening and preceding the exposing of said copper-containing metal region to said vapor phase ambient.

2. The method of claim 1, wherein said opening is formed in a first low pressure ambient and said vapor phase ambient is established in a second low pressure ambient without exposing said semiconductor device to air between exposing said semiconductor device to said first and second low pressure ambients.

3. The method of claim 2, wherein said first and second low pressure ambients are established in the same process chamber without performing a transport activity with said semiconductor device.

4. The method of claim 1, wherein said vapor phase ambient is established on the basis of a process temperature of approximately 80-350° C.

5. The method of claim 1, wherein said semiconductor device is exposed to said vapor phase ambient for approximately 10-60 seconds.

6. A method, comprising:
   providing a semiconductor device having a first metallization layer with a metal region embedded in a dielectric material;
   forming an opening in a second dielectric material of a second metallization layer in an etch ambient to expose a metal surface of said metal region;

exposing said metal surface exposed by said opening to a low pressure ambient containing a vapor of a corrosion hindering agent, wherein said corrosion hindering agent comprises at least one of triazole, 4-amino benzo nitril, 2-amino pyrimidin, 2-thiazolin-2-thiol and 2,4,6 tri-amino-1,3,5-triazin; and after exposing said metal surface to said low pressure ambient, forming a material layer on said metal surface, wherein said material layer is formed without a preceding wet chemical cleaning process performed prior to exposing said metal surface to said low pressure ambient containing said vapor.

7. The method of claim 6, further comprising introducing said semiconductor device into said low pressure ambient without exposure to air.

8. The method of claim 7, wherein said etch ambient and said low pressure ambient are established in the same process chamber.

9. The method of claim 7, further comprising removing excess material of metal components of said metal region to form said metal surface.

10. The method of claim 9, wherein forming said material layer comprises forming one of a conductive cap layer and a dielectric cap layer on said metal surface.

11. The method of claim 9, wherein removing said excess material comprises performing a chemical mechanical planarization process, and the method further comprises performing a cleaning process after exposing said metal surface to said low pressure ambient containing said vapor.

12. The method of claim 7, wherein forming said material layer comprises depositing a conductive barrier material in said opening.

13. The method of claim 6, wherein said low pressure ambient is established at a process temperature in the range of approximately 80-350° C.

14. The method of claim 6, wherein said metal surface comprises copper.

15. A method, comprising:

forming a via opening in a dielectric layer of a metallization layer of a semiconductor device in an etch ambient, the via opening connecting to a copper-containing metal region located below said via opening;

exposing a portion of said metal region exposed by said via opening to a vapor phase ambient without exposing said semiconductor device to air after exposing said semiconductor device to said etch ambient, wherein said vapor phase ambient comprises a vapor of a corrosion hindering agent comprising at least one of triazole, 4-amino benzo nitril, 2-amino pyrimidin, 2-thiazolin-2-thiol and 2,4,6 triamino-1,3,5-triazin; and after exposing said portion to said vapor phase ambient, forming a barrier/adhesion layer in said via opening, wherein said barrier/adhesion layer is formed without a wet chemical cleaning process performed after forming said via opening and preceding the exposing of said metal region to said vapor phase ambient.

\* \* \* \* \*